(12) United States Patent
Yang et al.

(10) Patent No.: US 8,996,956 B2
(45) Date of Patent: Mar. 31, 2015

(54) SEMICONDUCTOR DEVICE INCLUDING ECC CIRCUIT

(71) Applicant: SK Hynix Inc., Icheon-si Gyeonggi-do (KR)

(72) Inventors: Hyung Gyun Yang, Icheon-si Gyeonggi-do (KR); Hyung Dong Lee, Icheon-si Gyeonggi-do (KR); Yong Kee Kwon, Icheon-si Gyeonggi-do (KR); Young Suk Moon, Icheon-si Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 127 days.

(21) Appl. No.: 13/711,024

(22) Filed: Dec. 11, 2012

(65) Prior Publication Data

US 2014/0006902 A1 Jan. 2, 2014

(30) Foreign Application Priority Data

Jun. 29, 2012 (KR) .................. 10-2012-0070724

(51) Int. Cl.
*G11C 29/00* (2006.01)
*G11C 29/42* (2006.01)
*G11C 29/44* (2006.01)
*G11C 29/04* (2006.01)

(52) U.S. Cl.
CPC ............ *G11C 29/42* (2013.01); *G11C 29/4401* (2013.01); *G11C 29/787* (2013.01); *G11C 2029/0409* (2013.01); *G11C 2029/0411* (2013.01)
USPC ............................ 714/766; 714/784; 714/773

(58) Field of Classification Search
CPC ......................... G06F 11/1076; G06F 11/1008
USPC .......................... 714/766, 773, 784, 763, 769
See application file for complete search history.

(56) References Cited

U.S. PATENT DOCUMENTS

| | | | | |
|---|---|---|---|---|
| 4,768,193 | A * | 8/1988 | Takemae | 714/711 |
| 4,942,556 | A * | 7/1990 | Sasaki et al. | 365/200 |
| 6,858,081 | B2 * | 2/2005 | Biwa et al. | 117/89 |
| 6,915,476 | B2 | 7/2005 | Morino et al. | |
| 7,373,562 | B2 * | 5/2008 | Poechmueller | 714/710 |
| 7,688,658 | B2 * | 3/2010 | Yamada | 365/201 |

FOREIGN PATENT DOCUMENTS

KR 100712596 B1 4/2007

* cited by examiner

*Primary Examiner* — Fritz Alphonse
(74) *Attorney, Agent, or Firm* — William Park & Associates Patent Ltd.

(57) ABSTRACT

A semiconductor device includes a memory region configured to include a plurality of banks and a redundancy region within each of the banks and an error check and correction (ECC) region configured to detect an address of the memory region at which an error has occurred and correct a defect of the memory region by replacing the address at which the error has occurred with a redundancy line of the redundancy region based on address information.

14 Claims, 2 Drawing Sheets

SEMICONDUCTOR DEVICE INCLUDING ECC CIRCUIT

CROSS-REFERENCES TO RELATED APPLICATION

The present application claims priority under 35 U.S.C. §119(a) to Korean application number 10-2012-0070724, filed on Jun. 29, 2012, in the Korean Intellectual Property Office, which is incorporated herein by reference in its entirety.

BACKGROUND

1. Technical Field

The present invention relates generally to a semiconductor device, and more particularly, to a semiconductor device including an error check and correction (hereinafter referred to as 'ECC') circuit.

2. Related Art

After fabricating semiconductor memory devices, a defective memory cell is selected by performing a test. For example, a semiconductor memory device may be equipped with a circuit having an ECC function in order to improve the yield of the device.

The ECC circuit performs a function of detecting and correcting defective data in real time and adds additional parity bits to DQ bits when the DQ data of memory is transmitted. A semiconductor memory device detects a data error in DQ bits by checking whether the added parity bits, together with the DQ bits, are transmitted or not according to a specific rule. The number of DQ bits that can be verified and corrected may be limited depending on the number of parity bits. In other words, the number of parity bits restricts data error detection since error checking is done on the combination of parity bits and DQ bits. For example, if 2 parity bits are added to a DQ of 16 bits, "2-bit detection and 1 bit correction" may be generated by an ECC algorithm. Thus, in the case of this ECC circuit, an operation correction capability using parity bits may be limited.

SUMMARY

In an embodiment of the present invention, a semiconductor device includes a memory region configured to include a plurality of banks and a redundancy region within each of the banks and an error check and correction (ECC) region configured to detect an address of the memory region at which an error has occurred and correct a defect of the memory region by replacing the address at which the error has occurred with a redundancy line of the redundancy region based on address information.

In another embodiment of the present invention, a semiconductor device includes a memory region configured to include a plurality of banks and a redundancy region for repairing memory cells of each of the banks and an error check and correction (ECC) region configured to include a plurality of fuses, store an address at which an error has occurred, and replace the address at which the error has occurred with a redundancy line of the redundancy region using the fuse, wherein the address is controlled so that a method of storing the address depends on a scheme of the redundancy region irrespective of a number of DQ bits of the memory region when a defect of the memory region is detected.

In accordance with this technology, a semiconductor device having improved ECC capability is provided.

BRIEF DESCRIPTION OF THE DRAWINGS

Features, aspects, and embodiments are described in conjunction with the attached drawings, in which.

DETAILED DESCRIPTION

Hereinafter, a semiconductor device including an ECC circuit according to the present invention will be described below with reference to the accompanying drawings through various embodiments.

Figure 1:
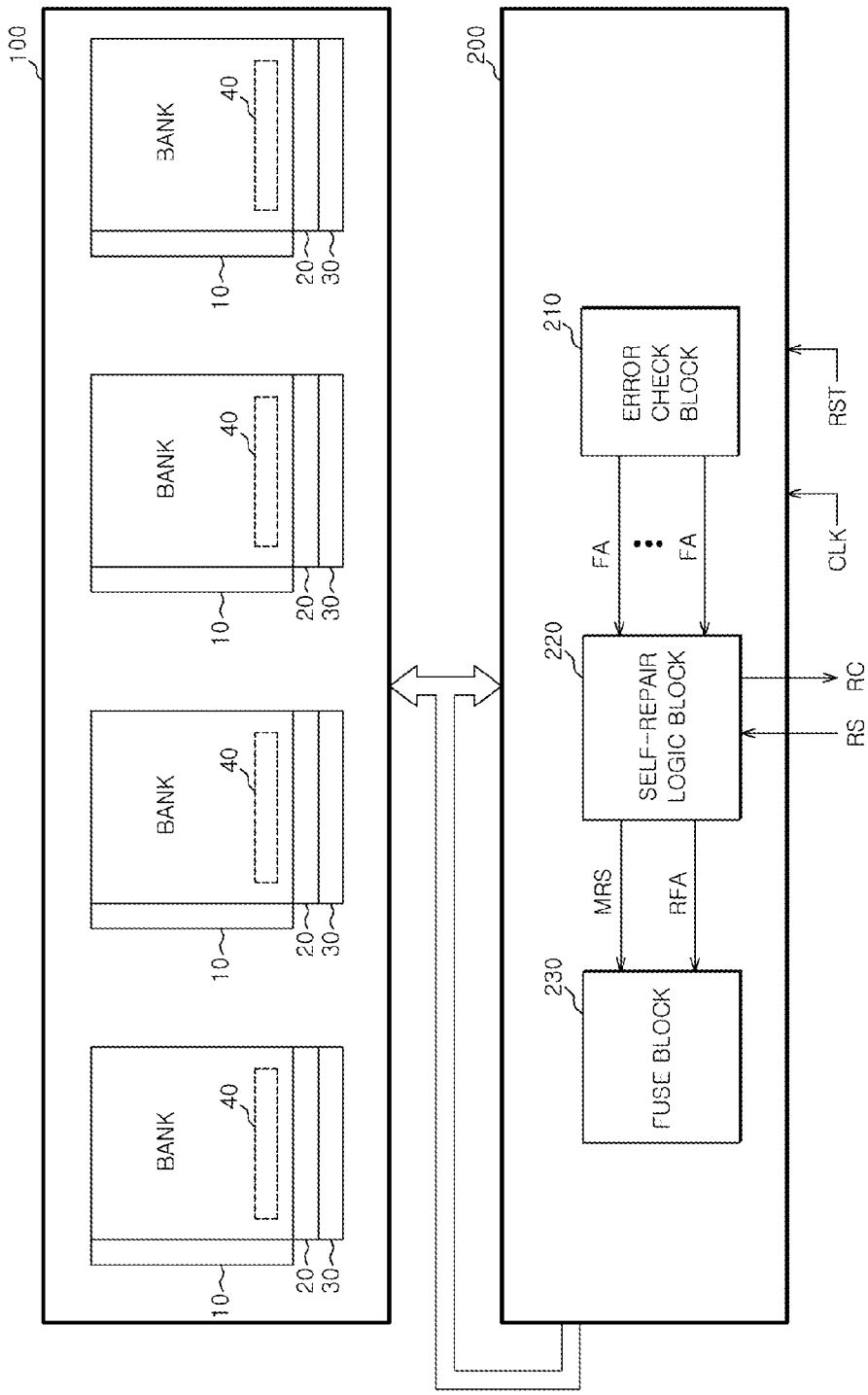
FIG. 1 shows the construction of a semiconductor device including an ECC circuit in accordance with an embodiment of the present invention.

FIG. 1 shows the construction of a semiconductor device including an ECC circuit in accordance with an embodiment of the present invention.

Referring to FIG. 1, the semiconductor device 1 including an ECC circuit in accordance with an embodiment of the present invention includes a memory region 100 and an ECC region 200

The memory region 100 includes a plurality of banks. Each bank includes a row decoder 10, a column decoder 20, a sense amplifier 30, and a redundancy region 40. The redundancy region 40 may be a row redundancy region where a defect of a bank is replaced for each row address, or a column redundancy region where a defect of a bank is replaced for each column address depending on the configuration of the bank, but not limited thereto. In the present embodiment, the redundancy region 40 is illustrated as being a row redundancy region, for convenience of description, but it is to be noted that the redundancy of a bank may be performed for each column address.

In an embodiment of the present invention, a defect of memory may be repaired using a redundancy line of the redundancy region 40 of the memory region 100 in response to a signal generated from the ECC region 200. This is described in detail below.

The ECC region 200 may store parity bits when a repair is requested in response to a clock CLK, a reset signal RST, and a repair start signal RS, and repair a defect of memory by replacing an address, corresponding to a parity bit, with a redundancy line of the redundancy region 40 of the memory region 100 using an electric fuse (hereinafter referred to as an 'E fuse') during test mode, for example, when a fuse address rupture mode is set. The ECC region 200 includes an error check block 210, a self-repair logic block 220, and a fuse block 230.

The error check block 210 detects whether an error occurred in the memory region 100 and provides corresponding error detection address information FA to the self-repair logic block 220.

The self-repair logic block 220 provides rupture address information RFA and a mode register set signal MRS to the fuse block 230 in response to the repair start signal RS and the error detection address information FA. The self-repair logic block 220 may provide the pieces of information to the fuse block 230 according to a predetermined rupture sequence and may provide a repair completion signal RC when a repair is completed, thus completing the repair operation. The repair completion signal RC may be illustrated as being a signal to indicate when a predetermined rupture sequence according to the mode register set signal MRS is finished. The repair completion signal RC is described briefly as it is not one of the major signals for achieving the objective of the present invention. The repair completion signal RC may be a signal that may be modified and applied by those skilled in the art.

The fuse block 230 ruptures a corresponding E fuse so that the E fuse is replaced with a redundancy line of the redundancy region 40 in response to the rupture address information RFA and the mode register set signal MRS.

Unlike a conventional ECC block, in an embodiment of the present invention, as described above, the number of parity bits is not limited to be proportional to the number of DQ bits, and instead, the number of parity bits may be determined according to a redundancy scheme criterion of the redundancy region 40. In addition, error correction capability may be improved by repairing a detected error using a redundancy line.

Figure 2:
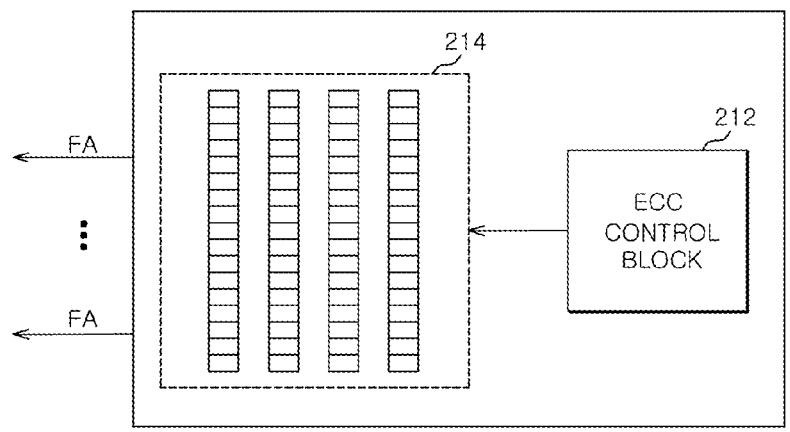
FIG. 2 is a block diagram of an error check block of FIG. 1.

FIG. 2 is a block diagram of the error check block 210 of FIG. 1.

Referring to FIG. 2, the error check block 210 includes an ECC control block 212 and a parity bit block 214.

The ECC control block 212 checks whether an error occurs or not in memory within the memory region 100 when the memory operates and detects an error if an error occurs. A conventional ECC control block performs a function of detecting and correcting an error, whereas the ECC control block 212 in accordance with an embodiment of the present invention performs a function of checking whether an error has occurred or not.

The parity bit block 214 accumulates generated errors and may perform a common Fail Bit Memory (FBM) function. As described above, the parity bit block 214 in accordance with an embodiment of the present invention may be configured different depending on a redundancy configuration scheme of the redundancy region (refer to 40 of FIG. 1) of the memory region (refer to 100 of FIG. 1). If a redundancy configuration scheme of the redundancy region (refer to 40 of FIG. 1) is a row redundancy scheme, a parity bit configuration of the parity bit block 214 is configured for each row address. If a redundancy configuration scheme of the redundancy region (refer to 40 of FIG. 1) is a column redundancy scheme, a parity bit configuration of the parity bit block 214 is configured for each column address.

The error check block 210 accumulates defects of memory generated in the memory region (refer to 100 of FIG. 1) for each row address parity bit and provides the error detection address information FA when the number of accumulated fail bits reaches a specific value. When the number of accumulated fail bits reaches the specific value, the repair start signal RS may be generated and transferred outside the memory, and a signal capable of correcting an error may be enabled.

As described above, in accordance with an embodiment of the present invention, the number of parity bits of the parity bit block 214 is not limited to a specific value of 1 to 2 bits that are added to DQ bits as in the prior art, but may be determined to be the number of bits for each row address. Accordingly, a bit detection and correction capability can be improved.

In addition, in the prior art, whether or not an error has occurred in data for each DQ bit is checked, and thus an error must be corrected within the correction capability of 1 to 2 bits added to the DQ bits. As a result, 3 defective bits, for example, cannot be corrected. In accordance with an embodiment of the present invention, however, the ECC capability can be greatly improved because the parity bit block 214 of the error check block 210 can be configured for each row address.

Figure 3:
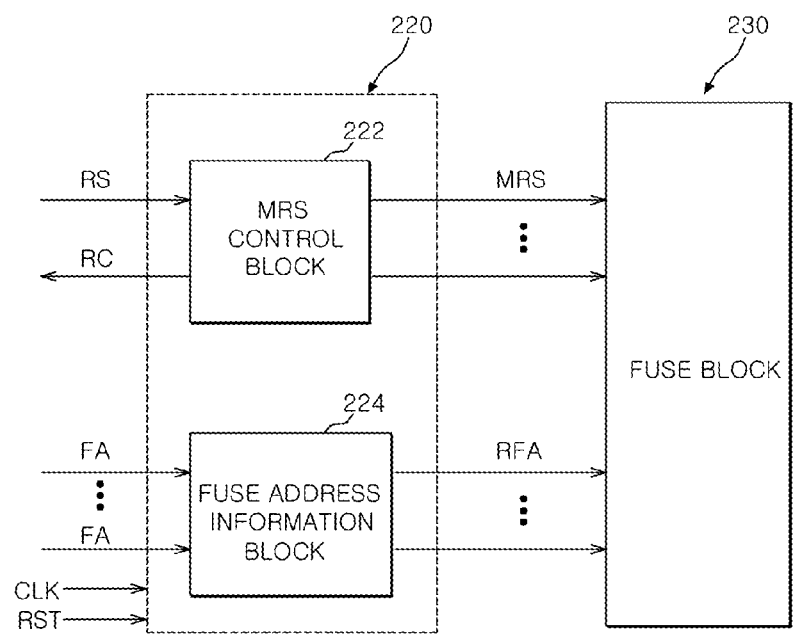
FIG. 3 is a block diagram of a fuse block and a self-repair logic block of FIG. 1.

FIG. 3 is a block diagram of the fuse block 230 and the self-repair logic block 220 of FIG. 1.

The self-repair logic block 220 in accordance with an embodiment of the present invention generates the rupture address information RFA and the mode register set signal MRS in response to the clock CLK, the reset signal RST, the repair start signal RS, and the error detection address information FA.

The self-repair logic block 220 includes an MRS control block 222 and a fuse address information block 224.

The MRS control block 222 generates the mode register set signal MRS for performing control so that a sequence in which an E fuse will be ruptured is entered in response to the repair start signal RS. Although the mode register set signal MRS is illustrated, it may include a combination of various address signals, such as a test mode signal within a range that can be understood by those skilled in the art. When MRS mode is released, the above-described reset signal RST may be used.

The fuse address information block 224 generates the rupture address information RFA in response to the error detection address information FA.

The fuse address information block 224 provides a corresponding E fuse address that will be ruptured in response to a row address at which an error was actually detected so that the row address is replaced with a row redundancy line of the redundancy region (refer to 40 of FIG. 1).

Accordingly, the self-repair logic block 220 provides the corresponding E fuse address based on information on the row address at which an error was detected when a repair is started, and provides the mode register set signal MRS so that the rupture sequence mode in which the corresponding E fuse will be ruptured is entered.

The fuse block 230 ruptures the corresponding E fuse address in response to the mode register set signal MRS and the rupture address information RFA.

The fuse block 230 includes a plurality of E fuses, which may be electrically fused. The fuse block 230 has the same function as a common E fuse block. The E fuses of the fuse block 230 in accordance with an embodiment of the present invention are illustrated as including the number of fuses corresponding to the number of defects of a plurality of cells, that is, the number of bits for each row.

As described above, in accordance with an embodiment of the present invention, by improving the existing ECC circuit having a limited correction function because the number of DQ bits is added, the memory region 100 is checked for each row address or each column address from when an error is detected, and an address at which an error is detected is replaced with a new redundancy line. Accordingly, the ECC capability may be improved. Furthermore, the reliability of a high-valued memory system requiring ECC support, for example, memory for a server or memory for a stack, may be improved.

While certain embodiments have been described above, it will be understood to those skilled in the art that the embodiments described are by way of example only. Accordingly, the semiconductor device described herein should not be limited based on the described embodiments. Rather, the device described herein should only be limited in light of the claims that follow when taken in conjunction with the above description and accompanying drawings.

What is claimed is:

1. A semiconductor device, comprising:
   a memory region configured to comprise a plurality of banks and a redundancy region within each of the banks; and
   an error check and correction (ECC) region configured to detect an address of the memory region at which an error has occurred and correct a defect of the memory region by replacing the address at which the error has occurred with a redundancy line of the redundancy region based on address information.

2. The semiconductor device according to claim 1, wherein the ECC region stores the address at which the error has occurred for each row address when a configuration of the redundancy region has a row redundancy scheme.

3. The semiconductor device according to claim 1, wherein the ECC region stores the address at which the error has occurred for each column address when a configuration of the redundancy region has a column redundancy scheme.

4. The semiconductor device according to claim 1, wherein the ECC region comprises:
   an error check block configured to detect the error occurred in the memory region and provide the address at which the error has occurred as error detection address information;
   a self-repair logic block configured to provide rupture address information which is address information to be fused in response to the error detection address information; and
   a fuse block configured to replace the address at which the error has occurred with the redundancy line of the redundancy region by fusing a corresponding fuse in response to the rupture address information.

5. The semiconductor device according to claim 4, wherein the fuse block comprises a plurality of electric (E) fuses.

6. The semiconductor device according to claim 4, wherein the self-repair logic block is further configured to provide a mode register set to the fuse block in response to a repair start signal and the error detection address information.

7. The semiconductor device according to claim 6, wherein the self-repair logic block comprises:
   an MRS control block configured to generate the mode register set signal for performing control so that a sequence in which the electric (E) fuses will be ruptured is entered in response to the repair start signal; and
   a fuse address information block configured to generate the rupture address information in response to the error detection address information and provide a corresponding electric (E) fuse address that will be ruptured in response to a row address at which an error was actually detected so that the row address is replaced with a row redundancy line of the redundancy region.

8. A semiconductor device, comprising:
   a memory region configured to comprise a plurality of banks and a redundancy region for repairing memory cells of each of the banks; and
   an error check and correction (ECC) region configured to comprise a plurality of fuses, store an address at which an error has occurred, and replace the address at which the error has occurred with a redundancy line of the redundancy region using the fuse, wherein the address is controlled so that a method of storing the address depends on a scheme of the redundancy region when a defect of the memory region is detected.

9. The semiconductor device according to claim 8, wherein:
   the ECC region stores the address at which the error has occurred for each row address if the scheme of the redundancy region is a row redundancy scheme, and
   the ECC region stores the address at which the error has occurred for each column address if the scheme of the redundancy region is a column redundancy scheme.

10. The semiconductor device according to claim 8, wherein the ECC region comprises:
    an error check block configured to detect the error occurred in the memory region and provide the address at which the error has occurred as error detection address information at specific timing;
    a self-repair logic block configured to provide rupture address information according to a rupture sequence in response to the error detection address information and an MRS signal; and
    a fuse block configured to replace the address at which the error has occurred with the redundancy line of the redundancy region by fusing the fuse in response to the rupture address information.

11. The semiconductor device according to claim 10, wherein the error check block comprises:
    an ECC control block configured to check whether the error has occurred or not in the memory region; and
    a parity bit block configured to accumulate the address at which the error has occurred.

12. The semiconductor device according to claim 8, wherein the fuse block comprises a plurality of electric (E) fuses.

13. The semiconductor device according to claim 10, wherein the self-repair logic block is further configured to provide a mode register set to the fuse block in response to a repair start signal and the error detection address information.

14. The semiconductor device according to claim 10, wherein the self-repair logic block comprises:
    an MRS control block configured to generate the mode register set signal for performing control so that a sequence in which the electric (E) fuses will be ruptured is entered in response to the repair start signal; and
    a fuse address information block configured to generate the rupture address information in response to the error detection address information and provide a corresponding electric (E) fuse address that will be ruptured in response to a row address at which an error was actually detected so that the row address is replaced with a row redundancy line of the redundancy region.

* * * * *